United States Patent [19]
Eriksson et al.

[11] Patent Number: 6,047,029
[45] Date of Patent: *Apr. 4, 2000

[54] POST-FILTERED DELTA SIGMA FOR CONTROLLING A PHASE LOCKED LOOP MODULATOR

[75] Inventors: Håkan B. Eriksson; Kjell B. Gustafsson, both of Lund, Sweden; Paul W. Dent, Pittsboro, N.C.

[73] Assignee: Telefonaktiebolaget LM Ericsson, Stockholm, Sweden

[ * ] Notice: This patent issued on a continued prosecution application filed under 37 CFR 1.53(d), and is subject to the twenty year patent term provisions of 35 U.S.C. 154(a)(2).

[21] Appl. No.: 08/931,430

[22] Filed: Sep. 16, 1997

[51] Int. Cl.$^7$ ................................................. H04B 14/06
[52] U.S. Cl. ........................................ 375/247; 375/376
[58] Field of Search ................................ 375/247, 254, 375/284, 285, 286, 294, 296, 371, 373, 376; 341/899, 143, 61; 327/113, 117

[56] References Cited

U.S. PATENT DOCUMENTS

| | | |
|---|---|---|
| 4,204,174 | 5/1980 | King . |
| 4,609,881 | 9/1986 | Wells . |
| 4,800,342 | 1/1989 | Jackson . |
| 4,965,531 | 10/1990 | Riley . |
| 5,038,117 | 8/1991 | Miller . |
| 5,055,802 | 10/1991 | Hietala et al. . |
| 5,079,521 | 1/1992 | Gaskell et al. . |
| 5,093,632 | 3/1992 | Hietala et al. . |
| 5,124,670 | 6/1992 | Lawton . |
| 5,220,327 | 6/1993 | Abbiate et al. ............ 341/143 |
| 5,329,553 | 7/1994 | Abbiate et al. . |

FOREIGN PATENT DOCUMENTS

| | | |
|---|---|---|
| 0 125 790 B1 | 11/1984 | European Pat. Off. . |
| 0 125 790 B2 | 11/1984 | European Pat. Off. . |
| 0 419 622 B1 | 4/1991 | European Pat. Off. . |
| 0429217A2 | 5/1991 | European Pat. Off. . |
| 0 438 867 A3 | 7/1991 | European Pat. Off. . |
| 0 438 867 B1 | 7/1991 | European Pat. Off. . |
| 0 546 466 A1 | 6/1993 | European Pat. Off. . |
| 2 238 434 | 5/1991 | United Kingdom . |
| WO 86/05045 | 8/1986 | WIPO . |
| WO 86/05046 | 8/1986 | WIPO . |
| WO 90/12458 | 10/1990 | WIPO . |

OTHER PUBLICATIONS

Victor da Fonte Dias, "Signal Processing in the Sigma–Delta Domain," Microelectronics Journal, vol. 26, No. 6, Sep. 1995, pp. 543–562.

Michael H. Perrott, et al., "SP 22.2: A 27mW CMOS Fractional–N Synthesizer/Modulator IC", 1997 IEEE International Solid–State Circuit Conference, ISSCC97/Session 22/Communications Building Blocks II/Paper SP 22.2.

Brian Miller, "A Multiple Modulator Fractional Divider", IEEE Transactions on Instrumentation and Measurement, vol. 40, No. 3, Jun. 1991, pp. 578–583.

Thomas A. D. Riley, et al., "A Simplified Continuous Phase Modulator Technique", IEEE Transactions on Circuits and Systems II: Analog and Digital Signal Processing, May 1994, vol. 41, No. 5, pp. 321–328.

*Primary Examiner*—Chi H. Pham
*Assistant Examiner*—Jean B Corrielus
*Attorney, Agent, or Firm*—Burns, Doane, Swecker & Mathis, L.L.P.

[57] ABSTRACT

A frequency synthesizer has a phase locked loop, a $\Delta\Sigma$ modulator, and a filter. The phase locked loop includes a frequency divider that controls the frequency of the phase locked loop output signal. The output of the $\Delta\Sigma$ modulator is fed the filter and the output of the filter is used to control a division factor in the frequency divider. Compensation may be performed at the input to the $\Delta\Sigma$ modulator in order to compensate for the filtering performed between the $\Delta\Sigma$ modulator and the frequency divider. The filter may be used to reduce quantization noise in an input to the frequency divider, and thereby reduces phase noise in an output of the phase locked loop.

14 Claims, 4 Drawing Sheets

POST-FILTERED DELTA SIGMA FOR CONTROLLING A PHASE LOCKED LOOP MODULATOR

FIELD OF THE INVENTION

The present invention relates to all areas where a ΔΣ controlled phase locked loop (PLL) is used as a frequency synthesizer and/or to generate a phase modulated signal. This applies, for instance, when using a PLL to generate continuous phase modulation (CPM), frequency shift keying (FSK) or quadrature amplitude modulation (QAM) by controlling a division factor in the PLL by means of a ΔΣ modulator. This technique can, for instance, be used in cellular, cordless satellite terminals and base stations.

BACKGROUND OF THE INVENTION

The implementation of continuous phase modulation in a transceiver has traditionally relied on using quadrature modulators. As illustrated in FIG. 1, a digital signal processing unit 101 receives the information to be transmitted by a signal 100 and generates the in-phase and quadrature components of the signal. These components are converted to analog signals using digital/analog converters 102a and 102b, and low pass filters 103a and 103b. The output of each filter modulates using multipliers 104a and 104b, one of two carriers 105a or 105b that are separated by 90° in phase. The outputs of the multipliers are then summed in an adder 106 to form the signal 107 which is to be amplified and transmitted.

Recently, continuous phase modulation based on using a ΔΣ modulator to control the division factor of a fractional-N phase locked loop was proposed by Riley et al. in "A Simplified Continuous Phase Modulation Technique," *IEEE Transaction on Circuits and Systems—II: Analog and Digital Signal Processing*, Vol. 41, pp. 321–326, May 1994. Phase locked loop frequency synthesis is a well-known technique for generating one of many related signals from a frequency variable voltage controlled oscillator (VCO). In a phase locked loop (PLL), an output signal from the VCO is coupled to a programmable frequency divider which divides the frequency of the PLL output by a selected number (the "division factor") to generate a frequency divided signal that is supplied to one input of a phase detector. The phase detector compares the frequency divided signal to a reference signal supplied by another fixed frequency oscillator, which, often, is selected for stability of frequency over time and environmental changes. Any difference in phase between the frequency divided signal and the reference signal is output from the phase detector, coupled through a loop filter, and applied to the VCO in a manner which causes the output signal from the VCO to change in frequency such that the phase error between the frequency divided signal and the reference signal is minimized. With a constant division factor, the output frequency step size is constrained to be equal to the reference signal frequency. With the phase locked loop, an engineering compromise must be struck between the competing requirements of loop lock time, output frequency step size, noise performance and spurious signal generation.

In order to overcome the limitations of the PLL, programmable frequency dividers capable of effectively dividing by non-integers have been developed. Output frequency step sizes which are fractions of the reference signal frequency are obtained while maintaining a high reference frequency and wide loop bandwidth. The synthesizers are known as fractional-N frequency synthesizers. Furthermore, a ΔΣ modulator can be used to control the frequency divider of the phase locked loop. Characteristics of a ΔΣ modulator are such that the quantization noise at its output tends to be toward the high end of the spectrum. The ΔΣ modulator is a quantizer that uses feedback to reduce the quantization noise in a limited frequency band. For this application, the ΔΣ modulator should preferably have low quantization noise within the bandwidth of the modulation.

As illustrated in FIG. 2, a conventional ΔΣ controlled phase locked loop can be described as consisting of two parts: a ΔΣ modulator 201 and a PLL 202. The output of the ΔΣ modulator 201 is used to control the division factor of a frequency divider in the PLL 202. A more detailed diagram of a conventional ΔΣ controlled phase locked loop modulator is illustrated in FIG. 3. A periodic reference signal 301 of frequency $r_{ref}$ is fed to a phase detector 302 together with the phase of the output of the frequency divider 306. The output of the phase detector 302 is a pulse that is related to the phase difference between the reference signal and the output of the frequency divider 306. The output of the phase detector 302 is filtered through a loop filter 303 and fed to a voltage controlled oscillator 304. Due to the feedback in the phase locked loop, the frequency of the output 305 of the VCO 304 is driven to equal the reference frequency multiplied by the division factor of the frequency divider 306. Hence, the frequency and the phase of the output of the VCO 304 can be controlled by controlling the division factor. In the ΔΣ controlled phase locked loop modulator, the division factors are generated by using a ΔΣ modulator 310. The division factor of the frequency divider can be changed once every period of the reference frequency. The wave generator 307 generates, based on the information signal 300, the input to the ΔΣ modulator 310. Channel selection can be performed by adding in an adder 308, an offset 309 to the input of the ΔΣ modulator 310. The output of the ΔΣ modulator 310 is then used to control the division factor in the frequency divider 306.

The output of the waveform generator is the instantaneous frequency of the desired modulated signal divided by the reference frequency and sampled at the rate of the reference frequency. The oversampling factor, η, of the ΔΣ controlled phase locked loop modulator is $$\eta = f_{ref}/\text{symbol rate}.$$

The input to the ΔΣ modulator is the instantaneous frequency of the desired modulated signal sampled at a rate equal to $f_{ref}$. The reference frequency $f_{ref}$ is chosen high enough and the bandwidth of the PLL wide enough for the modulation to fulfill the spectrum and/or the phase noise requirement on the modulation.

Because the phase locked loop is a low pass filter, with respect to the instantaneous frequency, the phase locked loop can be regarded as a means for reconstruction of the desired modulation signal. By choosing the bandwidth of the phase locked loop sufficiently high for the desired modulation to pass, the output of the VCO consists of a signal corresponding to the desired instantaneous frequency and phase noise corresponding to the quantization noise of the ΔΣ modulator. The phase noise can be reduced by either increasing the oversampling factor or by increasing the roll-off of the filtering performed by the phase locked loop. The latter is difficult without jeopardizing the stability margins of the phase locked loop. As a result, prior systems must rely on the use the high oversampling factors. However, a ΔΣ controlled phase locked loop modulator has many benefits. For example, it enables a cost and space efficient implementation, and guarantees that continuous phase in the modulation as well as channel selection can be controlled in a purely direct and digital manner.

In a mobile station and terminals in cordless cellular and satellite communication systems, or in any other equipment with limited power supply, it is desired to keep the oversampling factor of the PLL as low as possible. With a limited oversampling factor, however, the technique of $\Delta\Sigma$ controlled PLL modulation will fail the spectrum and/or the phase noise requirement on the modulation. This is because the filtering by the PLL will not be able to sufficiently filter the quantization noise without distorting the modulation. Thus, there is a need for a method and apparatus for reducing the amount of quantization noise in the signal applied to the frequency divider from the $\Delta\Sigma$ modulator.

SUMMARY OF THE INVENTION

The present invention includes filtering the output of the $\Delta\Sigma$ modulator and using the filtered output to control the division factor of a phase locked loop. Filtering the output of the $\Delta\Sigma$ modulator reduces the quantization noise in the signal used to control the frequency divider. This, in turn, reduces the phase noise in the output of the phase locked loop. According to one embodiment of the present invention, a frequency synthesizer containing a phase locked loop, a $\Delta\Sigma$ modulator and a filter are disclosed. The output of the $\Delta\Sigma$ modulator is fed through the filter and the output of the filter is used to control the division factor in the frequency divider.

In another aspect of the invention, compensation may be performed at the input to the $\Delta\Sigma$ modulator in order to compensate for the filtering performed between the $\Delta\Sigma$ modulator and the frequency divider.

According to another embodiment of the invention, a continuous phase modulator is disclosed. The continuous phase modulator comprises a phase locked loop comprising detector means responsive to a reference signal and a phase control signal for generating a control signal that varies in dependence upon the phase difference between the reference signal and the phase control signal. Means responsive to the control signal generate an output signal whose frequency varies in dependence upon the control signal. Divider means divides the output signal to provide the phase control signal, the dividing means having a control input and being operable to vary its division ratio in dependence upon a ratio control signal applied to said control input. $\Delta\Sigma$ modulator means responsive to an information signal and an offset signal provides a ratio control signal. Filter means filters the ratio control signal from the $\Delta\Sigma$ modulator means to reduce quantization noise in the ratio control signal, wherein the filtered ratio control signal adjusts the division ratio of the frequency divider. Adjusting means adjust the information signal prior to its being supplied to the $\Delta\Sigma$ modulator means, wherein the adjustment compensates for the action of the filter means.

BRIEF DESCRIPTION OF THE DRAWINGS

The invention will now be described in more detail with reference to the accompanying drawings, in which.

DETAILED DESCRIPTION

The present invention relates to all areas where a $\Delta\Sigma$ controlled phase locked loop (PLL) is used as a frequency synthesizer and/or to generate a phase modulated signal. This applies, for instance, when using a PLL to generate continuous phase modulation (CPM), frequency shift keying (FSK) or quadrature amplitude modulation (QAM) by controlling a division factor in the PLL by means of a $\Delta\Sigma$ modulator. This technique can, for instance, be used in cellular, cordless satellite terminals and base stations.

Figure 1:
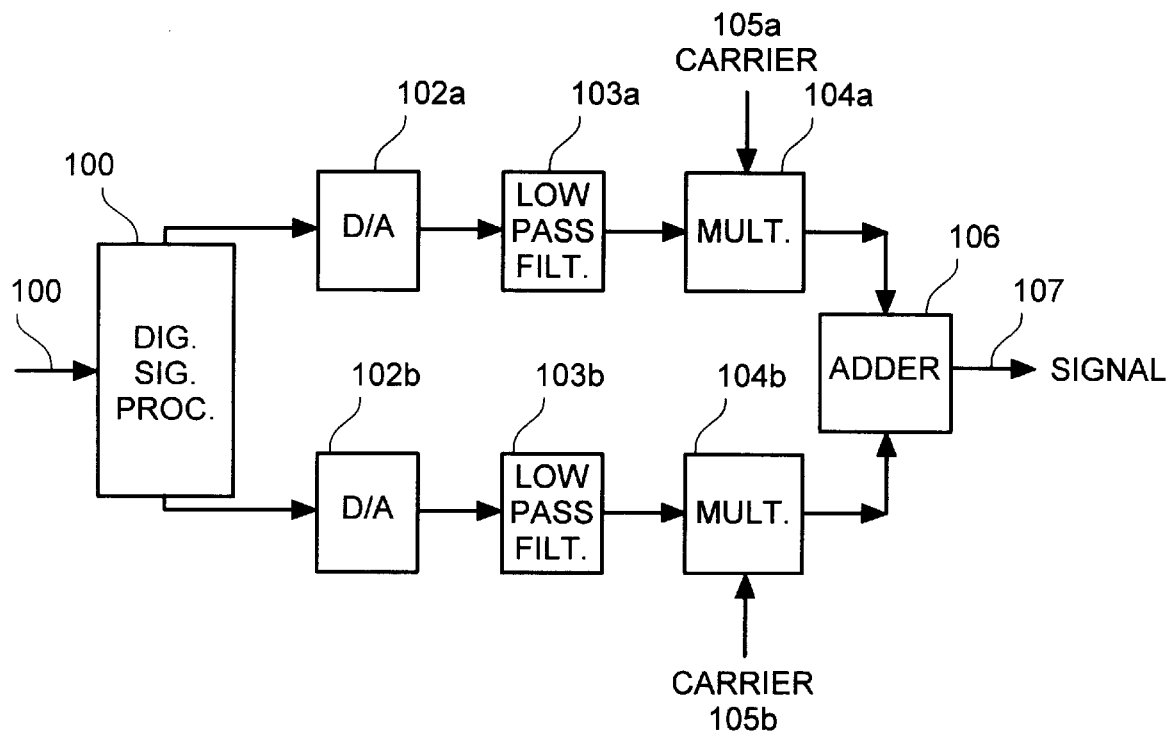
FIG. 1 illustrates a prior art quadrature modulator.
Figure 2:
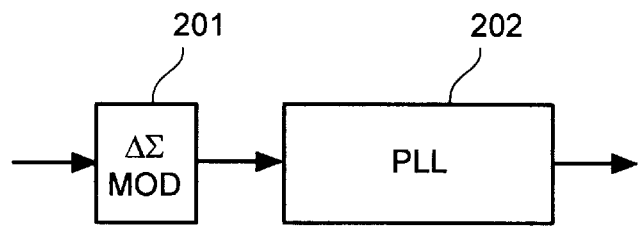
FIG. 2 illustrates a prior art $\Delta\Sigma$ controlled phase locked loop.
Figure 3:
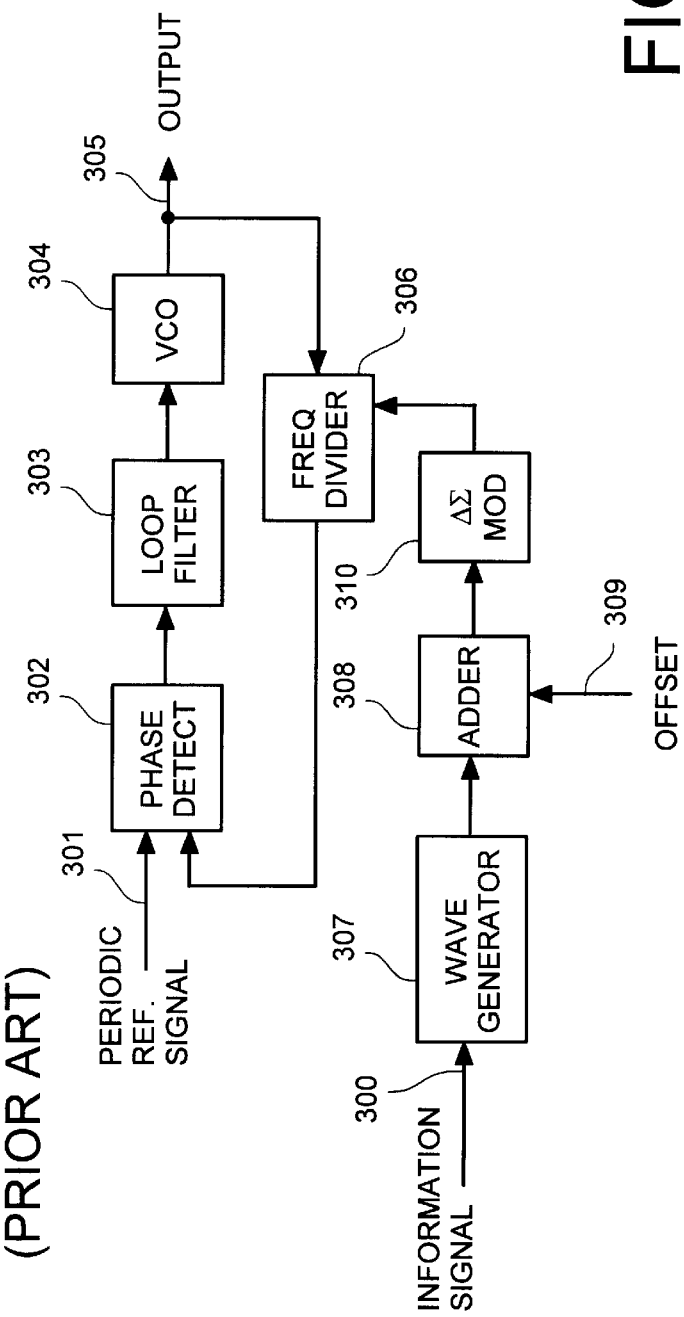
FIG. 3 illustrates a prior art $\Delta\Sigma$ controlled phase locked loop for generating CPM.
Figure 4:
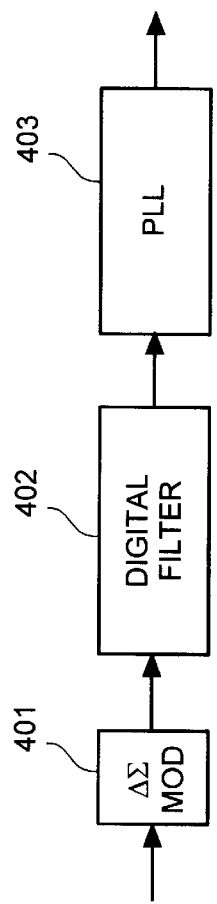
FIG. 4 illustrates a post-filtered $\Delta\Sigma$ modulator for controlling a phase locked loop according to one embodiment of the present invention.

A post-filtered $\Delta\Sigma$ modulator for controlling a phase locked loop is illustrated in FIG. 4. A digital filter 402 is introduced between the $\Delta\Sigma$ modulator 401 and the phase locked loop 403. By filtering the output of the $\Delta\Sigma$ modulator 401, the quantization noise in the output signal produced by the $\Delta\Sigma$ modulator 401 can be reduced within certain frequency regions. The reduction in quantization noise can, in turn, be traded for reduced oversampling rate and/or decreased phase noise. This enables the $\Delta\Sigma$ controlled phase locked loop modulation to be used with a limited oversampling factor.

Figure 5:
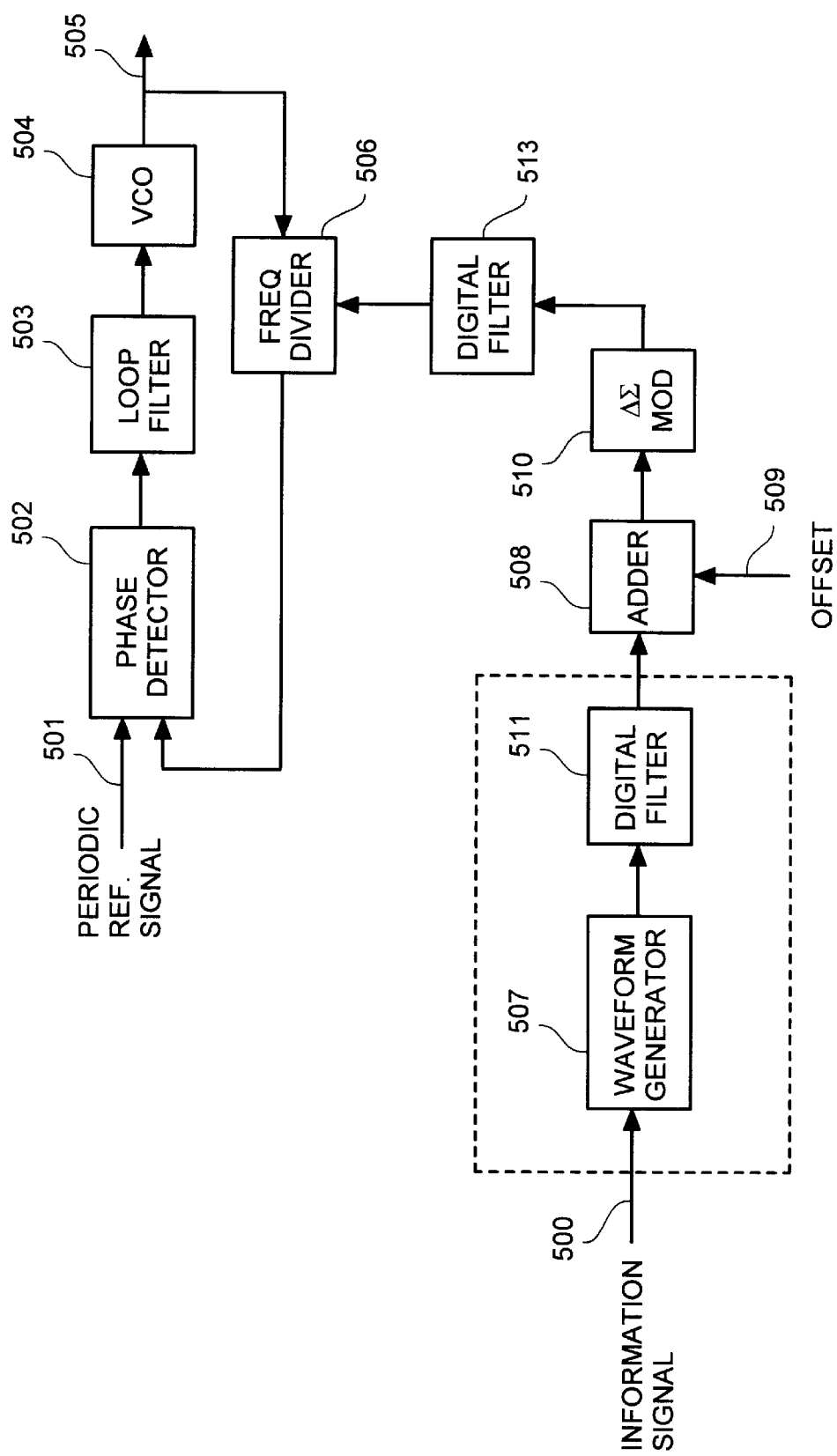
FIG. 5 illustrates a post-filtered $\Delta\Sigma$ modulator for controlling a phase locked loop according to one embodiment of the present invention.

According to the present invention, a transceiver can be enhanced by using the post-filtered $\Delta\Sigma$ controlled phase locked loop modulator depicted in FIG. 5. The phase locked loop consists of a phase detector 502, a loop filter 503, a voltage controlled oscillator 504, and a frequency divider 506. The periodic reference signal 501 of frequency $f_{ref}$ is fed to the phase detector 502 together with the phase of the output of the frequency divider 506. The output of the phase detector 502 is a pulse that is related to the phase difference between the reference signal and the output of the frequency divider 506. The output of the phase detector 502 is filtered through a loop filter 503 and fed to a voltage controlled oscillator (VCO) 504. Due to the feedback in the phase locked loop, the frequency of the output of the VCO 504 is driven to equal the reference frequency multiplied by the division factor in the frequency divider 506. Hence, the frequency of the voltage controlled oscillator 504 can be controlled by controlling the division factor.

In the $\Delta\Sigma$ controlled phase locked loop modulator, the division factors are generated by using a $\Delta\Sigma$ modulator 510 whose output is first filtered by a digital filter 513 before being supplied to the frequency divider 506. The purpose of the digital filter 513 is to reduce the quantization noise in the output signal produced by the $\Delta\Sigma$ modulator 510 within certain frequency regions. The $\Delta\Sigma$ modulator 510 may be any type of $\Delta\Sigma$ modulator, such as one of those described in Steven R. Northsworthy, Richard Schrier and Gabor Temes, *Delta-Sigma Data Converters, Theory, Design and Simulation*, IEEE Press 1997. According to this exemplary embodiment, the phase locked loop is designed so as to filter the phase noise sufficiently to fulfill the spectrum and/or the phase noise requirements on the modulation. A waveform generator 507 receives an information signal 500 and generates an input for the $\Delta\Sigma$ modulator 510. Prior to being supplied to the $\Delta\Sigma$ modulator 510, however, the generated input signal is first supplied to a prefilter 511, which predistorts the generated input signal so as to compensate for the distortion caused by the digital filter 513. The predistortion can be implemented by distorting the input of the $\Delta\Sigma$ modulator, that is, the desired instantaneous frequency, or by using a waveform generator where the desired predistortion affects the pulse shaping as defined by the modulation scheme.

Several examples will now be presented to illustrate techniques for designing the filter 513. First, consider a situation in which a ΔΣ controlled PLL is to be used to generate modulation for a mobile communications systems in accordance with the European GSM standards. The waveform generator 507 in this case should perform Gaussian filtering. The output of the PLL will then be a Gaussian Minimum Shift Keying (GMSK) modulated signal distorted by the quantization noise generated in the PLL resulting in phase noise. The most critical part to fulfill in the GSM specification is that the phase noise should be less than −60 dBc/Hz at ±400 kHz. Therefore, reducing the quantization noise at 400 kHz is important. The invention offers a simple solution to this problem, as follows.

Consider a reference signal $f_{ref}$=13 MHz, as is often used in GSM. The filter 513 can then be chosen such that its impulse response is, for example $$h(k)=\delta(k)+\delta(k-16), \quad (1)$$

where $\delta(0)=1$ and $\delta(k)=0$ for all $k \neq 0$. Then the digital filter 513 would have a notch at 13/30 MHz. This filter has an attenuation of about 12 dB at 400 kHz and a DC gain of 6 dB. The prefilter 511 should then be the inverse filter of h(k) within the bandwidth of the modulation. For the case described above, it is sufficient for the prefilter 511 to compensate for the DC gain with a prefilter containing only one tap equal to ½. The prefilter 511 could, of course, be included in the filtering of the waveform generator 507.

As another example, consider a situation in which it is important to reduce the phase noise of a frequency synthesizer's PLL at neighboring frequency channels. For GSM this would correspond to having a digital filter 513 with notches at, for example, ±200 kHz, ±400 kHz and ±800 kHz. Where the sampling rate of the reference signal 501 is 13 MHz, this can approximately be achieved by a digital filter 513 having an impulse response $$h(k)=\delta(k)+\delta(k-31).$$

The prefilter 511 could then be a one-tap filter having a gain of one-half.

Note that the coefficients of the digital filter 513 were chosen such that the output of the digital filter 513 is integer valued as long as its input is integer valued. This is an important feature because the frequency divider 506 can only deal with integer valued division factors. The range of the output is twice the range of the input. This has to be taken into consideration when designing the frequency divider.

From the above two examples, one can draw the following conclusions: The invention offers a simple way to reduce phase noise in the PLL within certain frequency regions. A simple digital filter 513 that is easy to implement and will only consume minor power compared to the ΔΣ modulator can reduce the phase noise of the PLL significantly.

As to the digital filtering in prefilter 511, it can typically be described by the relation $$N(n)=b_1x(k)+b_2x(k-1)+ \ldots +b_{k+1}x(k-n)-a_2N(K-1)- \ldots -a_{m+1}N(K-m)$$

where N(n) is the output of the filter used to control the frequency divider in the phase locked loop and x(n) is the output of the ΔΣ modulator. The parameters m, n, $a_1, a_2 \ldots a_m, a_{m+1}$ and $b_1, b_2 \ldots b_m, b_{m+1}$ can be chosen to give the quantization noise certain properties or reduce the quantization noise. Note, however, that the parameters must be chosen such that the output corresponds to a valid division factor in the frequency divider of the phase locked loop.

Channel selection can be performed by using an adder 508 to add an offset 509 to the input of the ΔΣ modulator 510. The reduction in quantization noise can be traded for reduced oversampling rate and/or decreased phase noise, thus enabling the ΔΣ controlled phase locked loop modulation to be used with a limited oversampling factor.

The choice of the ΔΣ modulator is dependent on the desired application. Higher order ΔΣ modulators, possibly implemented using multiple stage (cascade) structures can be used. To enable channel selection over a wide range, the ΔΣ modulator is preferably implemented as a multi-level ΔΣ modulator. The reference signal 501 is preferably a periodic signal. The output of the VCO forms the signal 505 which is to be amplified and transmitted by the transceiver.

Figure 6:
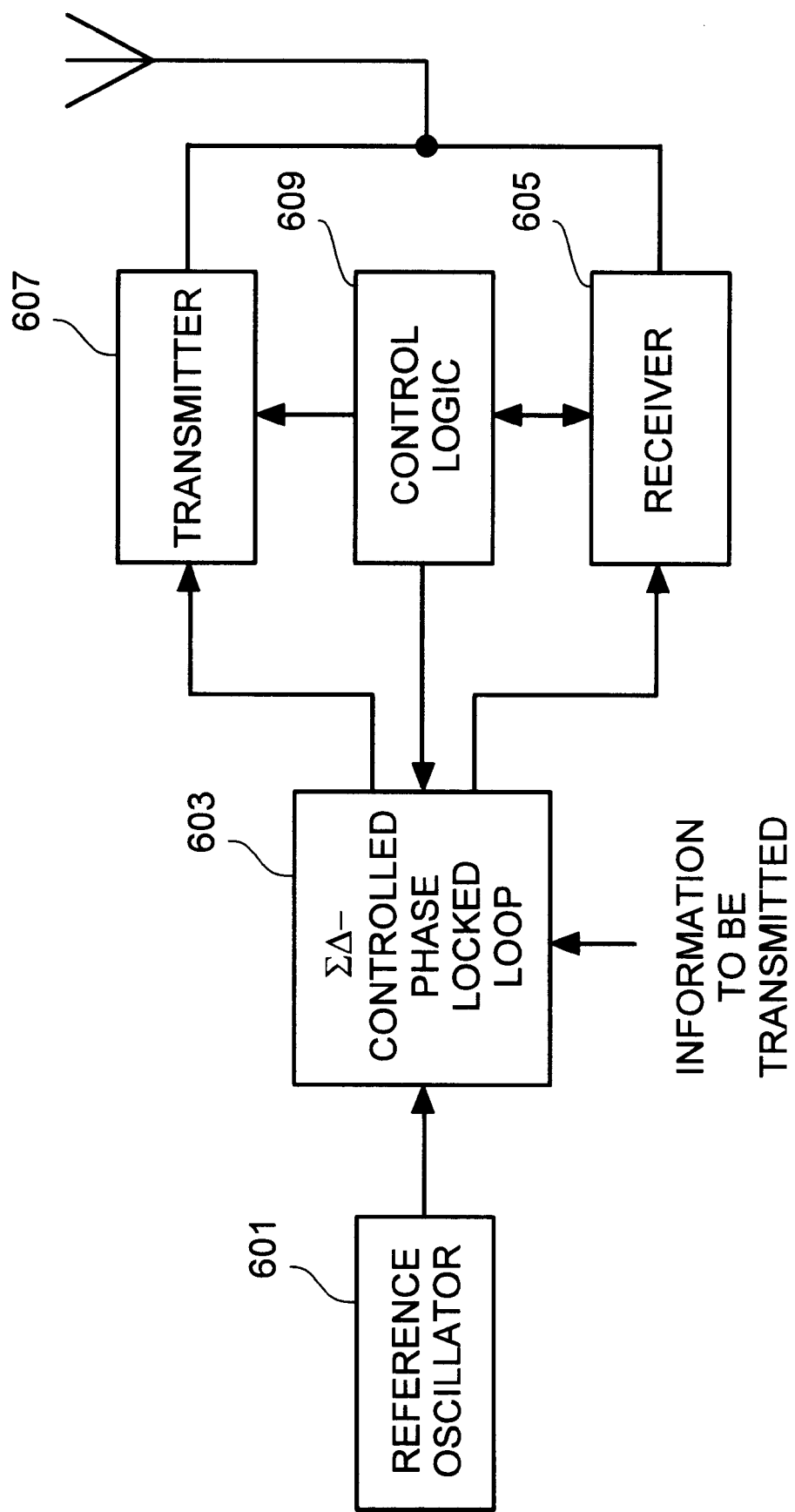
FIG. 6 illustrates a transceiver that employs aspects of the invention.

A transceiver which can employ the present invention is illustrated in FIG. 6. A reference oscillator 601 provides a reference signal, $f_{ref}$, which remains relatively constant in frequency over time and in extremes of environment and is applied to a ΔΣ-controlled phase locked loop 603 along with the information to be transmitted. The output of the ΔΣ-controlled phase locked loop 603 is used by both the receiver 605 and the transmitter 607 to produce the local oscillator signal and the modulated transmit signal, respectively. In particular, the ΔΣ-controlled phase locked loop 603 supplies a phase-modulated signal to the transmitter 607, and a carrier signal to the receiver 605. In alternative embodiments, amplitude modulation can additionally be introduced in the transmitter 607 when, for example QAM is used. In this case, information to be transmitted should also be supplied to the transmitter 607. In any case, control over functions of the transceiver, such as channel of operation frequency, is provided by the control logic 609.

It will be apparent to those of ordinary skill in the art that the present invention can be embodied in other specific forms without departing from the spirit or essential character thereof. The present disclosed embodiments are, therefore, intended in all respects to be illustrative and not restrictive. The scope of the invention is indicated by the appended claims rather than the foregoing description, and all changes which come within the meaning and range of equivalents thereof are intended to be embraced therein.

What is claimed is:

1. A frequency synthesizer, comprising:
   a phase locked loop comprising a frequency divider that receives a phase locked loop feedback signal at a first frequency divider input, and divides the feedback signal by a division factor, wherein the frequency divider has a second frequency divider input for receiving the division factor;
   a ΔΣ modulator for modulating an input signal; and
   filter means, wherein the output of the ΔΣ modulator is fed through the filter and the output of the filter is supplied to the second frequency divider input for use as the division factor.

2. The frequency synthesizer according to claim 1, wherein compensation is performed at an input to the ΔΣ modulator in order to compensate for the filtering performed between the ΔΣ modulator and the frequency divider.

3. The frequency synthesizer according to claim 1, wherein said filter means reduces quantization noise in an input to the frequency divider, and thereby reduces phase noise in an output of the phase locked loop.

4. The frequency synthesizer according to claim 1, wherein the filter means has a frequency response that is characterized by having one or more notches.

5. A continuous phase modulator, comprising:
   a phase locked loop comprising:
      detector means responsive to a reference signal and a phase control signal for generating a control signal that varies in dependence upon the phase difference between the reference signal and the phase control signal;
      means responsive to said control signal for generating an output signal whose frequency varies in dependence upon the control signal; and
      frequency divider means having a first input that receives the output signal, wherein the frequency divider means divides the output signal to provide the phase control signal, said frequency divider means also having a control input and being operable to vary its division ratio in dependence upon a final ratio control signal applied to said control input;
   ΔΣ modulator means responsive to an information signal to provide an initial ratio control signal; and
   filtering means for filtering said initial ratio control signal from said ΔΣ modulator means to reduce quantization noise in said initial ratio control signal, wherein said filtered ratio control signal is supplied to the control input for use as the final ratio control signal for adjusting the division ratio of the frequency divider means.

6. The continuous phase modulator according to claim 5, further comprising:
   means for adjusting the information signal prior to its being supplied to the ΔΣ modulator means, wherein the adjustment compensates for distortion introduced by the filtering means.

7. The continuous phase modulator according to claim 5, wherein said filtering means reduces quantization noise in an input to the frequency divider means, and thereby reduces phase noise in an output of the phase locked loop.

8. The continuous phase modulator according to claim 5, wherein a channel selection is performed by adding an offset to the input of the ΔΣ modulator.

9. The continuous phase modulator according to claim 5, wherein said ΔΣ modulator means is a multi-level ΔΣ modulator which allows channel selection over a wide frequency range.

10. The continuous phase modulator according to claim 5, wherein said means for filtering has a frequency response that is characterized by having one or more notches.

11. A method of synthesizing a signal having a frequency, comprising the steps of:
   using a phase locked loop to generate the signal, wherein the frequency of the signal is controlled by a frequency divider in the phase locked loop, and wherein:
      the frequency divider has a first input for receiving the signal;
      the frequency divider has a second input for receiving a division factor; and
      the frequency divider divides the signal by the division factor;
   using a Δ93 modulator to generate a modulated signal;
   generating a filtered signal by filtering the modulated signal; and
   using the filtered signal to control the division factor in the frequency divider.

12. The method of claim 11, further comprising the step of:
   supplying a compensated input signal to the ΔΣ modulator, wherein the compensated input signal is made to compensate for the filtering of the modulated signal.

13. The method of claim 11, wherein the step of generating a filtered signal reduces quantization noise in an input to the frequency divider, and thereby reduces phase noise in an output of the phase locked loop.

14. The method of claim 11, wherein the step of generating a filtered signal is characterized by using notch filtering techniques.

* * * * *